(12) United States Patent
Berndt et al.

(10) Patent No.: US 6,903,429 B2
(45) Date of Patent: Jun. 7, 2005

(54) MAGNETIC SENSOR INTEGRATED WITH CMOS

(75) Inventors: Dale F. Berndt, Plymouth, MN (US);
Andrzej Peczalski, Eden Prairie, MN (US); Eric E. Vogt, Minneapolis, MN (US); William F. Witcraft, Minneapolis, MN (US)

(73) Assignee: Honeywell International, Inc., Morristown, NJ (US)

( * ) Notice: Subject to any disclaimer, the term of this patent is extended or adjusted under 35 U.S.C. 154(b) by 100 days.

(21) Appl. No.: 10/413,377

(22) Filed: Apr. 15, 2003

(65) Prior Publication Data

US 2004/0207031 A1 Oct. 21, 2004

(51) Int. Cl.[7] .......................... H01L 27/14; H01L 29/82; H01L 29/84
(52) U.S. Cl. ..................... 257/414; 257/108; 257/206; 257/207; 257/208; 257/210; 257/252; 257/347; 257/401; 257/421; 257/422; 257/423; 257/424; 257/425; 257/426; 257/427
(58) Field of Search ........................ 257/108, 206–208, 257/210, 252, 347, 401, 414, 421–427

(56) References Cited

U.S. PATENT DOCUMENTS

| 4,607,271 A | * | 8/1986 | Popovic et al. ............. 257/422 |
|---|---|---|---|
| 4,739,264 A | * | 4/1988 | Kamiya et al. ............. 324/251 |
| 4,875,011 A | * | 10/1989 | Namiki et al. ............. 324/251 |
| 5,548,151 A | * | 8/1996 | Funaki et al. ............. 257/421 |
| 5,572,058 A | * | 11/1996 | Biard ......................... 257/421 |
| 5,591,996 A | * | 1/1997 | Haigh et al. ............. 257/238 |
| 6,590,389 B1 | * | 7/2003 | Shibasaki et al. ........... 324/252 |
| 2001/0045602 A1 | * | 11/2001 | Maeda et al. ............. 257/347 |
| 2002/0186584 A1 | * | 12/2002 | McDowell et al. ........ 365/171 |
| 2003/0094943 A1 | * | 5/2003 | Ashley et al. ............. 324/251 |

OTHER PUBLICATIONS

E. Schurig et al. "A Vertical Hall Device in CMOS high-voltage Technolgy" Sensors and Actuators, A 97–98 (2002) 47–53.

* cited by examiner

Primary Examiner—Amir Zarabian
Assistant Examiner—Ida M. Soward
(74) Attorney, Agent, or Firm—Shaw Pittman LLP

(57) ABSTRACT

A magnetic sensor device formed using SOI CMOS techniques includes a substrate, a silicon oxide layer and in some cases a plurality of gated regions. A first terminal is located between two innermost gated regions and supplies a supply voltage. A second and a third terminal, each of which is located between two adjacent gated regions other than the two innermost gated regions, output positive and negative Hall voltages. By appropriately controlling a bias voltage to the gated regions, small changes in a magnetic field induces larger currents in channel regions under the gated regions, which, in turn, results in detectable Hall voltages.

31 Claims, 9 Drawing Sheets

Vertical Hall Sensor - Cross Section

Vertical Hall Sensor - Cross Section

Crossection of Horizontal Hall Sensor

MAGNETIC SENSOR INTEGRATED WITH CMOS

This invention was made with Government support under contract no. N00014-01-2-0009 with the Department of the Navy. The Government has certain rights to this invention.

BACKGROUND

1. Field of the Invention

The present invention relates generally to magnetic sensors, and more particularly, to magnetic sensors integrated with semiconductor devices.

2. Background of the Invention

Magnetoelectronics is a growing field that is devoted to the development of electronic device structures that incorporate a ferromagnetic element. As shown in FIG. 1, when a write current (Iw) is applied to an integrated, contiguous write wire 11 that is directly over a ferromagnetic element 12, a magnetic field (H) is generated that is parallel with and close to a surface of the write wire 11. The magnitude of the magnetic field (H) is determined by an inductive coefficient ($\alpha$) and the write current (Iw), i.e., H=$\alpha$Iw. The magnetization of the ferromagnetic film is a function of the magnetic field and follows a hysteresis loop like that shown in FIG. 2.

The bi-stable orientation characteristic of the hysteresis loop of FIG. 2 is a defining characteristic of ferromagnetic materials and a natural basis for nonvolatile bit storage. Basically, when the magnetic field is larger than a switching field (Hs), the magnetization of the ferromagnetic film reaches a first saturation value (Ms). The magnetization is thereafter maintained at this first saturation value and particular orientation for periods as long as years, even when power is removed. The orientation of the magnetization changes when a magnetic field with a reversed direction is applied to the ferromagnetic element. The magnetization, however, drops down slightly when the reversed magnetic field is applied until the reversed magnetic field is less than –Hs. In this situation, the magnetization and output voltage jump promptly from the first saturation value (Ms, Vout) to the second saturation value (–Ms, –Vout), as shown in FIG. 2. The magnetization state is then maintained at the second saturation value for extremely long periods unless the magnetic field reaches Hs again.

Magnetoelectronic devices leverage the hysteresis-loop characteristic of ferromagnetic material to perform specific functions, such as "latching" data, Boolean operations and like functions. To detect a result of a Boolean operation, for example, magnetoelectronic devices also require a magnetic field sensor to detect the magnetic field induced by the ferromagnetic material.

Magnetic field sensors based on the Hall-effect are presently the most widely used magnetic sensor. When a magnetic field is applied perpendicularly to an electric conductor, a voltage is generated transversely to a current flow direction in the electric conductor. This phenomenon is called the Hall effect and the voltage generated is called Hall voltage. Therefore, magnetoelectronic devices typically utilize a Hall sensor to sense the orientation of the magnetic field induced by a magnetic element.

One example of a magnetoelectronic device is described in Mark Johnson et al.'s article entitled "Hybrid Hall Effect Device" which was first published in 1997. In Johnson et al.'s article, a single microstructured ferromagnetic film and a micro scale Hall cross are fabricated together to create a magnetoelectronic device. Magnetic fringe fields from the edge of the ferromagnet generate a Hall voltage in the Hall cross. The sign of the fringe field, as well as the sign of the output Hall voltage, is switched by reversing the magnetization of the ferromagnet. The Hall cross thus detects the Hall voltage and outputs a value (high or low) corresponding to the direction of the magnetization of the ferromagnet.

Hall sensors are not only used for detecting a magnetic field. Hall sensors also provide signals that can be used for implementing various sensing and control functions. Discrete Hall sensors, coupled with current-excitation and signal-conditioning blocks, provide a voltage output in the presence of a magnetic field. A number of integrated circuit sensor ICs ease the design task by combining Hall sensors and peripheral circuitry to provide linear or switched outputs. The majority of presently-available Hall sensors are low-cost discrete devices. The allure of contactless sensing, low parts cost, and easy design-in make Hall devices the sensors of choice in hundreds of automotive, aircraft, appliance, and tool applications.

FIG. 3 represents a discrete Hall sensor device 30 consistent with known vertical Hall (VH) technology. As shown, sensor device 30 comprises five contacts 301–305 arranged in a line on top of a deep n-type wafer 310 of about 30 µm. In addition, two P-diffusion wells 320 laterally surround an active area of the Hall sensor device where contacts 301–305 are located. In operation, contact 303 is supplied with a supply voltage Vs and contacts 301 and 305 are grounded so that when a magnetic field Hs, having a direction oriented into the paper is applied, current flows are generated from contact 303 to contacts 302 and 304, and to contacts 301 and 305. Hall voltages VH+ and VH– are thus generated and can be detected at contacts 302 and 304.

FIG. 4 is a schematic diagram showing the distribution of the current flow within the deep n-type substrate 310. As the deep n-type substrate 310 has a depth of about 30 µm, sensor device 30 is open downwards and allows a deep current flow. Since the sensitivity of a Hall sensor decreases as the sensing distance increases, new miniaturization techniques that increases the sensitivity of a Hall sensor device are desirable.

A present trend is to integrate Hall sensors with semiconductor integrated circuits instead of employing discrete Hall sensor ICs. Such integration allows a system approach thereby improving the sensor performance despite the mediocre characteristics of basic Hall cells. Among various integrated circuits, CMOS integrated circuits (Complementary Metal Oxide Semiconductor) are considered preferred over bipolar integrated circuits because CMOS provides a higher level of integration and lower power and cost.

One example of integrating Hall sensors with CMOS is disclosed by E. Schurig et al. in the article entitled "A Vertical Hall Device in CMOS High-Voltage Technology". The vertical Hall sensor described in this article is built in bulk CMOS, which has a cross-sectional view as shown in FIG. 5.

Similar to the conventional VH sensor of FIG. 3, Hall sensor device 50 of FIG. 5 also comprises five contacts 501–505. These five contacts 501–505, however, are arranged in a line on top of a low-doped, active n-diffusion region 510, which has a depth of about 7 µm. In this known Hall sensor structure, the sensor device 50 also comprises two P-diffusion wells 520 laterally surrounding the active area of the Hall sensor 50.

As the n-diffusion layer 510 in this device has a depth of about 7 µm, the current flow distribution in the sensor can be limited to 7 μm, as shown in a distribution diagram of FIG. 6. With the distribution distance decreased, the concentration of the current flow is closer to the contacts 502 and 504. Thus, the sensitivity of the Hall sensor device to the magnetic field is increased compared to that of the VH sensor device of FIG. 3.

Although Hall sensor device 50 of FIG. 5 has increased sensitivity for detecting a magnetic field in comparison with the VH sensor of FIG. 3, a Hall sensor device having still higher sensitivity is always desired as it helps to simplify overall system designs, reduce cost, and decrease power consumption.

SUMMARY OF THE INVENTION

One aspect of the present invention is to provide a magnetic sensor integrated with CMOS. The present invention is particularly applicable in SOI (Silicon on Insulator) CMOS which extends standard bulk CMOS to a very high integration level, high temperature environment or radiation hard applications.

Another aspect of the present invention is to provide a magnetic sensor integrated with SOI CMOS in which vertical Hall sensors are fabricated in combination with gate regions that are maintained at predetermined potentials by associated gate electrodes.

The features of the present invention and attendant advantages thereof will be more fully understood upon a reading of the following detailed description along with the associated drawings.

DETAILED DESCRIPTION OF THE INVENTION

Figure 1:
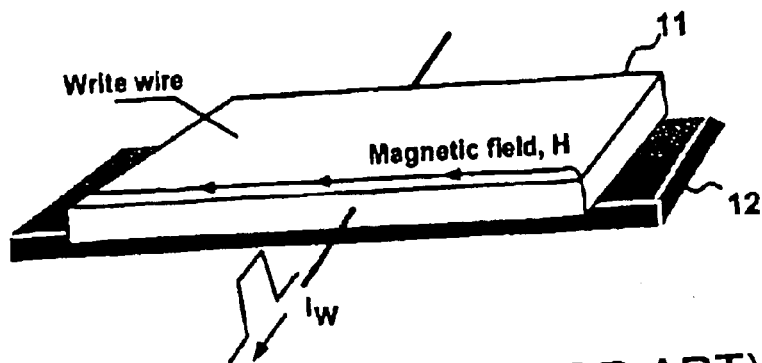
FIG. 1 is a schematic diagram illustrating the magnetic field induced along a surface of a thin ferromagnetic film when a write current is applied adjacent the film.
Figure 2:
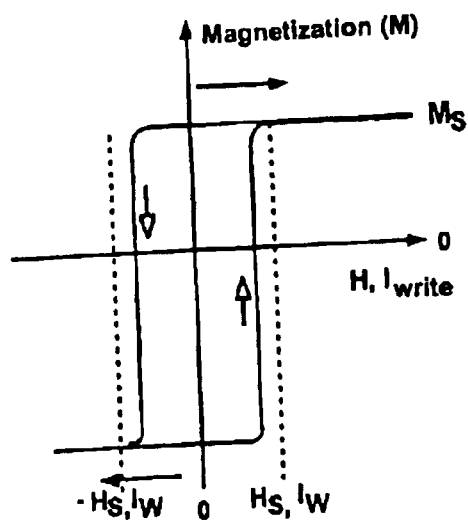
FIG. 2 is a diagram showing a hysteresis loop of a ferromagnetic element.
Figure 3:
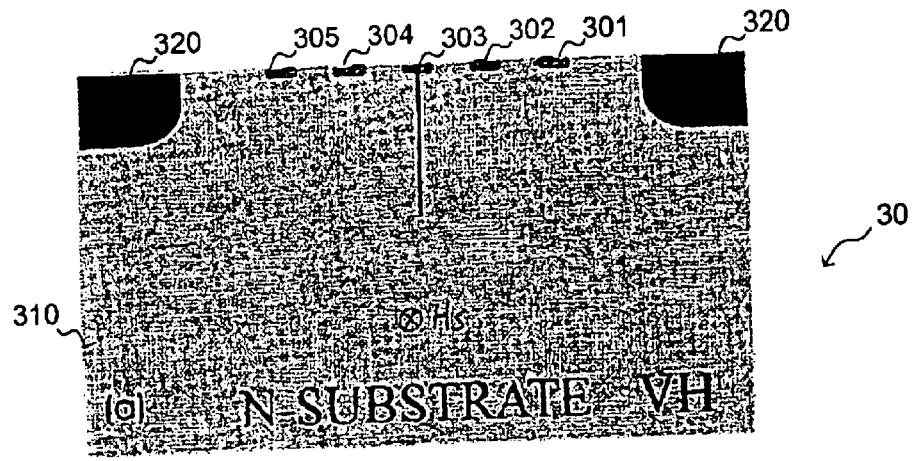
FIG. 3 is a cross-sectional view of a conventional VH sensor structure.
Figure 4:
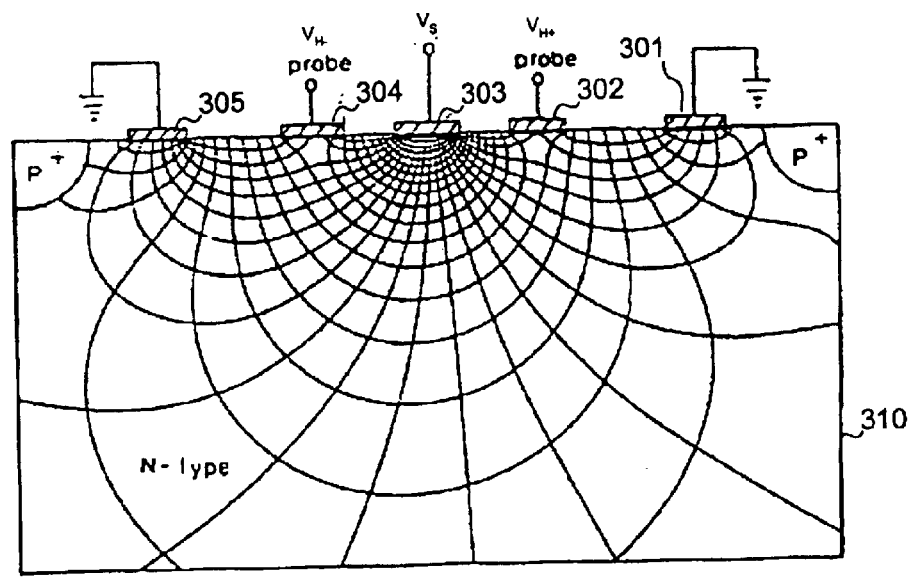
FIG. 4 is a current distribution diagram of the conventional VH sensor of FIG. 3.
Figure 5:
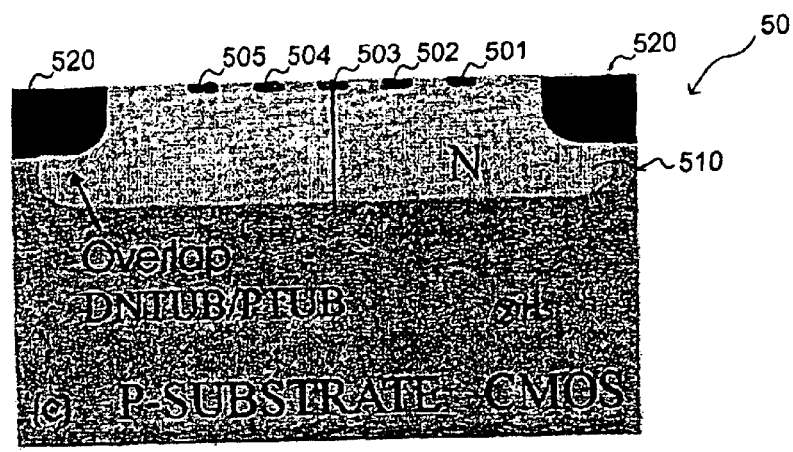
FIG. 5 is a cross-sectional view of a conventional Hall sensor device which is fabricated in a bulk CMOS process.
Figure 6:
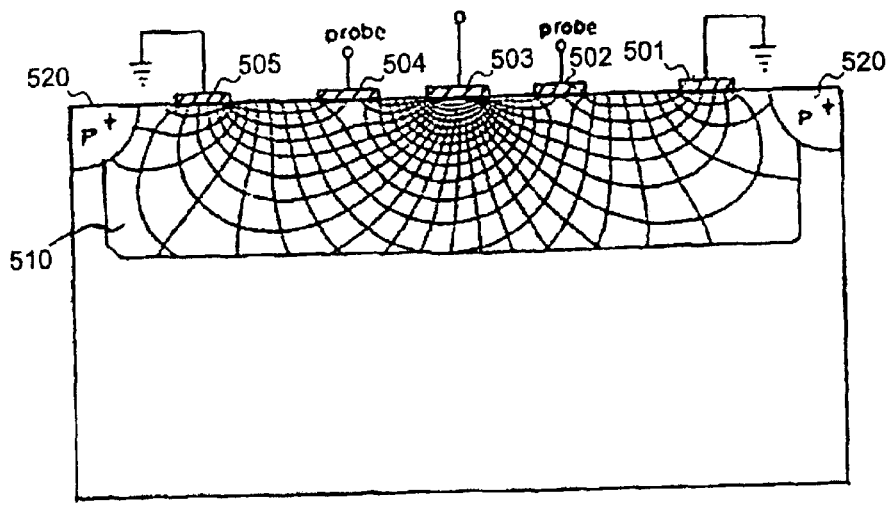
FIG. 6 is a current distribution diagram of the conventional Hall sensor device of FIG. 5.

The present invention provides a Hall sensor device that can be fabricated integrally with SOI (silicon on isolator) CMOS. SOI CMOS has a capability of extending the standard bulk CMOS to a high temperature environment or radiation hard applications It also is becoming a technology of choice for next generations of very dense integrated circuits. In the case of bulk CMOS, as shown in FIG. 3, P/N type MOS transistors are isolated from a well layer such as n-well region 310. The PN junction formed between wells in bulk transistors do not exist as complete depletion type transistors. Also, the junction capacity is very small. Therefore, the Hall sensor device is not coupled with an amplification device like a transistor that may increase the overall sensitivity.

Figure 8:
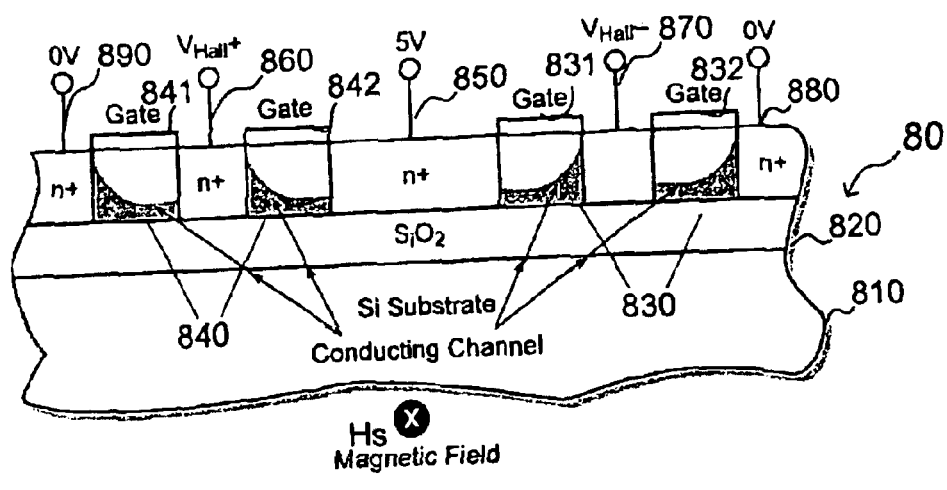
FIG. 8 is a cross-sectional diagram of the vertical Hall sensor of FIG. 7.

In contrast, according to the present invention, a SOI CMOS device, of which a cross-sectional view is illustrated in FIG. 8, a Si supporting substrate (810 in FIG. 8) and buried oxide film 820 are provided. Also, the device is structured such that each element is completely isolated by LOCOS (Local Oxidation of Silicon) oxide film from other devices in the lateral direction. The operating element areas are completely isolated by insulators. As the buried oxide film 820 isolates transistors from substrate 810, a distribution area of a current induced by a magnetic field is shallower compared to the conventional vertical Hall sensors in CMOS devices. Accordingly, a Hall sensor that is built using SOI CMOS techniques according to the present invention has a higher sensitivity.

In the exemplary embodiment shown in FIG. 8, the Hall sensor is a vertical Hall sensor that senses a magnetic field parallel to the surface of the wafer surface. It is appreciated, however, that other Hall sensor configurations can also be implemented, including the following horizontal Hall sensors that detect magnetic field vertical to the surface of semiconductor: island isolated sensors, PN junction isolated sensors and gated island isolated sensors, all of which are fabricated integrally with the SOI CMOS and described in more detail later herein.

Figure 7:
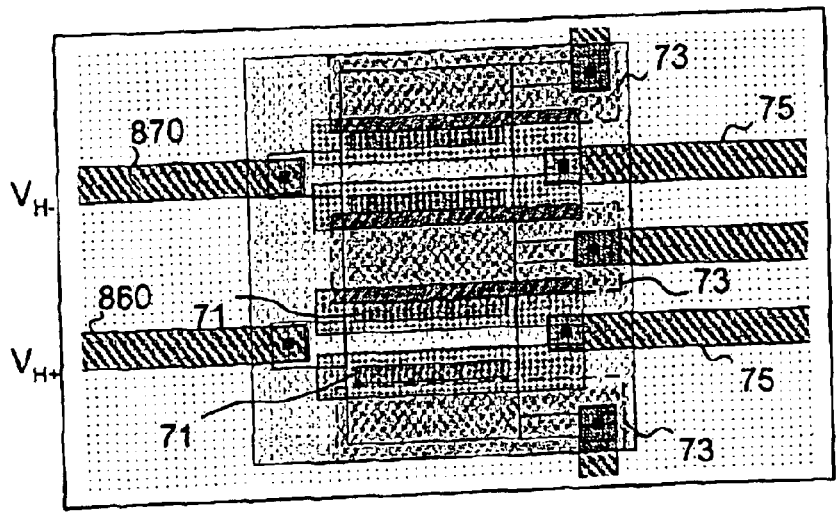
FIG. 7 is a layout of a vertical Hall sensor that is fabricated integrally with SOI CMOS in accordance with the present invention.
Figure 10:
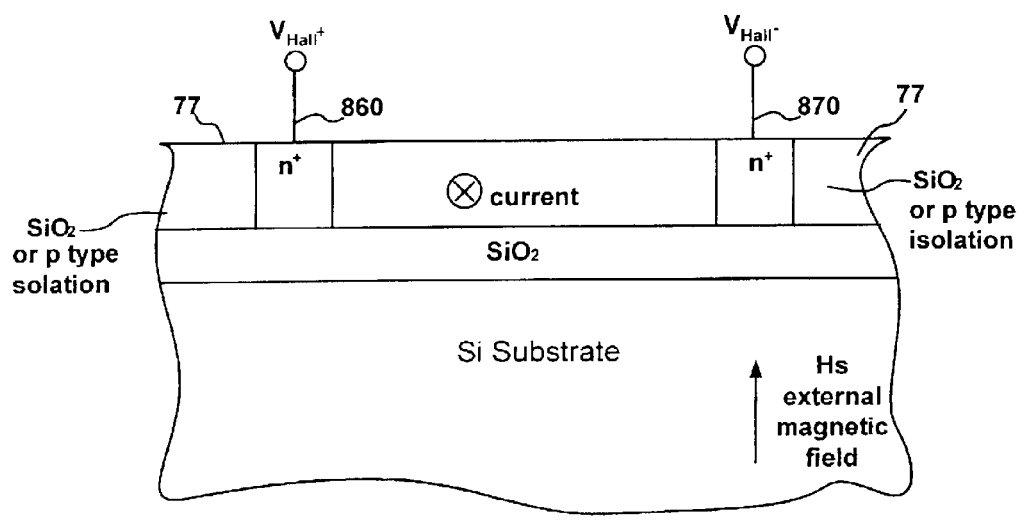
FIG. 10 is a cross-sectional diagram viewed from line 10—10 of FIGS. 14–17, showing the gate regions are isolated with oxides or PN junctions.

With reference to FIG. 7, the four areas marked with reference number 71 are gated regions of the vertical sensors that are Si island isolated, and those marked with reference number 73 are sensing areas of the lateral sensor where the current has a strong vertical component which is necessary for detection of the horizontal magnetic field. Due to the structure of a SOI CMOS, the isolation between the four gated regions is typically achieved either by a Silicon island (which is typical for SOI CMOS) separated by a trench filled with oxide, or a traditional PN junction. Trenches filled with oxide or traditional PN junctions are shown in FIG. 10 (marked by reference number 77). FIG. 10 is a cross-sectional view of FIGS. 14–17 through line 10—10. The active sensing areas 73 may be either implanted n-type (for example) high voltage FET implantation or inversion layer MOSFET (gated sensor) or both. The layout of FIG. 7 also shows bias points 75 on a side of the gated regions 71 for supplying a bias voltage to the gated regions 71.

Reference is again made to FIG. 8. As a general rule, SOI CMOS devices comprises a Si supporting substrate 810 and buried oxide film 820. Also, these devices are structured such that each element of the device is completely isolated by a LOCOS oxide layer such that SOI active layers are completely isolated by insulators. LOCOS isolation may be replaced by pn junction isolation as required. In the exemplary embodiment of FIG. 8, gated vertical Hall sensor 80 includes two dual gate transistors 830 and 840 built on a low doped, n-type island. Each of the dual gate transistors 830 and 840 includes a first gate 831 and 841 and a second gate 832 and 842. The first and second gates 831, 841 and 832, 842 correspond to gated regions 71 of FIG. 7. A supply voltage terminal 850 located between these two dual transistors 830 and 840 supplies an input voltage (e.g., 5V) to a drain or source (not identified) of the transistors 830 and 840 which are close to the supply terminal 850. A source or drain of the transistor 830 and 840 at a far end from the supply terminal 850 are grounded, as shown by grounded terminals 880 and 890. It is noted that the two dual gate transistors 830 and 840 are symmetrical with each other and the polarities of these transistors can be chosen based on the specific application. Hall voltages VH+ and VH− can be sensed at terminals 860 and 870 located between first and second gates 831 and 832 of transistor 830, and between first and second gates 841 and 842 of transistor 840, respectively as shown in FIG. 7 and FIG. 8.

Figure 9:
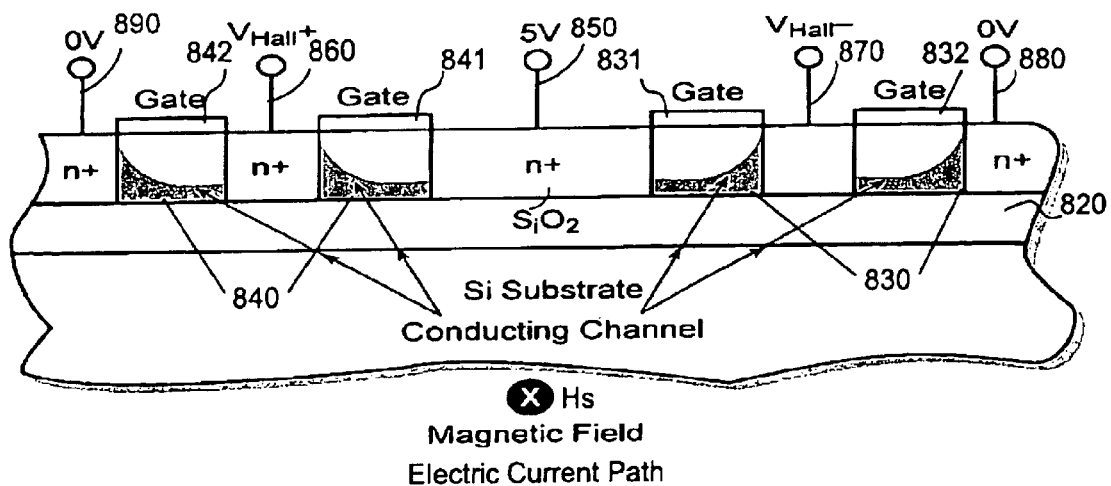
FIG. 9 is a current distribution diagram of in the vertical Hall sensor of FIG. 7.

In one experiment, a horizontal magnetic field Hs up to 200 Oe parallel to the long side of the gate regions 71 (i.e., in the direction oriented into the paper for FIG. 8) was applied to the sensor 80 with a current strap (not shown) just above the sensor. FIG. 9 is a current distribution diagram of the Hall sensor of FIG. 8. In operation, supply terminal 850 supplies a supply voltage (e.g., 5V) to Hall sensor 80. In the presence of the bias, a current is induced at the junction of the supply voltage and carriers of the current tend to travel from the supply terminal 850 to grounded terminals 880 and 890 through channels under the gates 831, 832, 841 and 842. To guarantee a smooth traveling of the carriers, in accordance with a preferred embodiment, gates 831, 832, 841 and 842 are biased by bias voltages so that the gate regions or channels are slightly depleted to allow the carriers traveling deep in channels under the gates 831, 832, 841, and 842. Applying the magnetic field directed into the page of FIG. 9 creates a positive change of the channel region potential under gate 841 and a negative change of the channel potential under gate 831. The potential change leads to a change of the voltage between the gates and channel and therefore increases the current in the 831 and decreases the current flowing under the gate 841. Since the higher current causes larger Hall voltage, there is positive feedback created in the device 840 and negative feedback in the device 830. This leads to a decrease in the potential of terminal 860 and an increase in the terminal 870. Accordingly, consistent with small-signal amplification theory, a small change in channel region potential (due to the presence of the magnetic field) generates a continuous and significant output voltage between terminals 860 and 870. Because of the amplification, the Hall voltages sensed at terminals 860 and 870 is significantly increased. As a result, the sensitivity of the Hall sensor 80 is increased.

Figure 11:
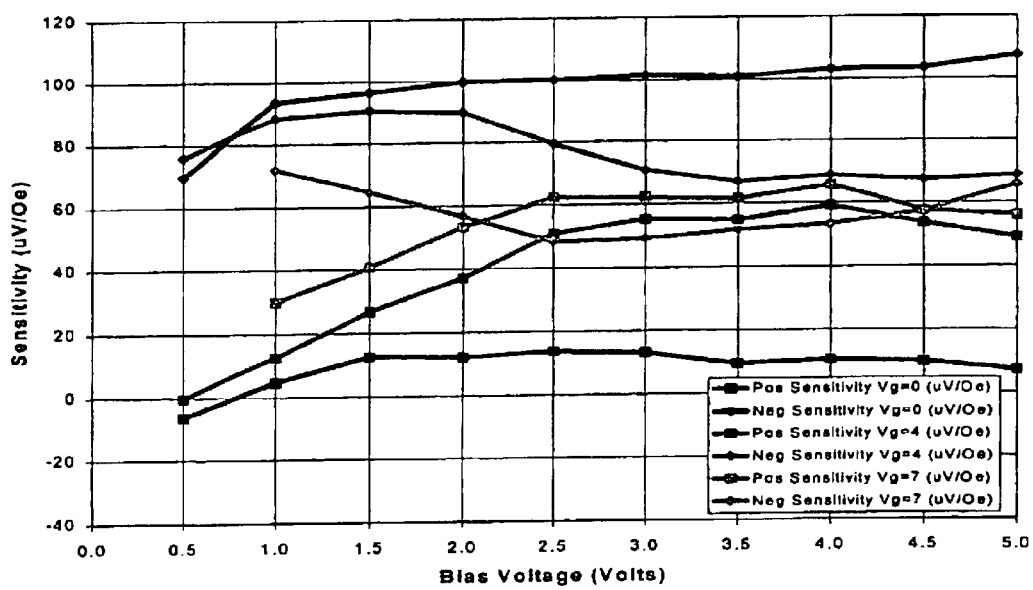
FIG. 11 shows relationship curves of sensitivity versus bias voltage which were obtained by experiment with a vertical Hall sensor in accordance with the present invention.
Figure 12:
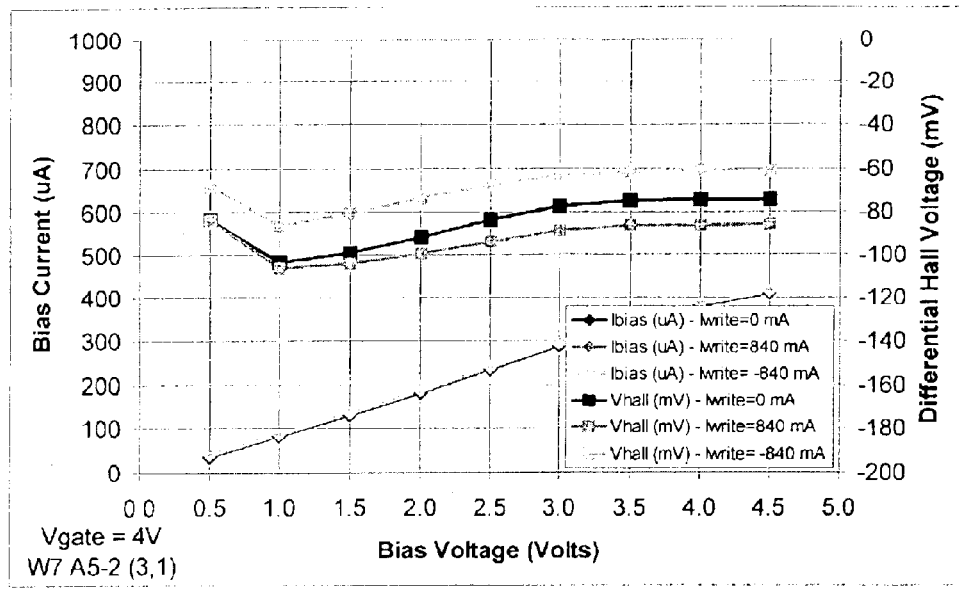
FIG. 12 shows relationship curves of bias current versus bias voltage and differential Hall voltage versus bias voltage which were obtained by experiment with a vertical Hall sensor in accordance with the present invention, in which a gate voltage was maintained at 4V.
Figure 13:
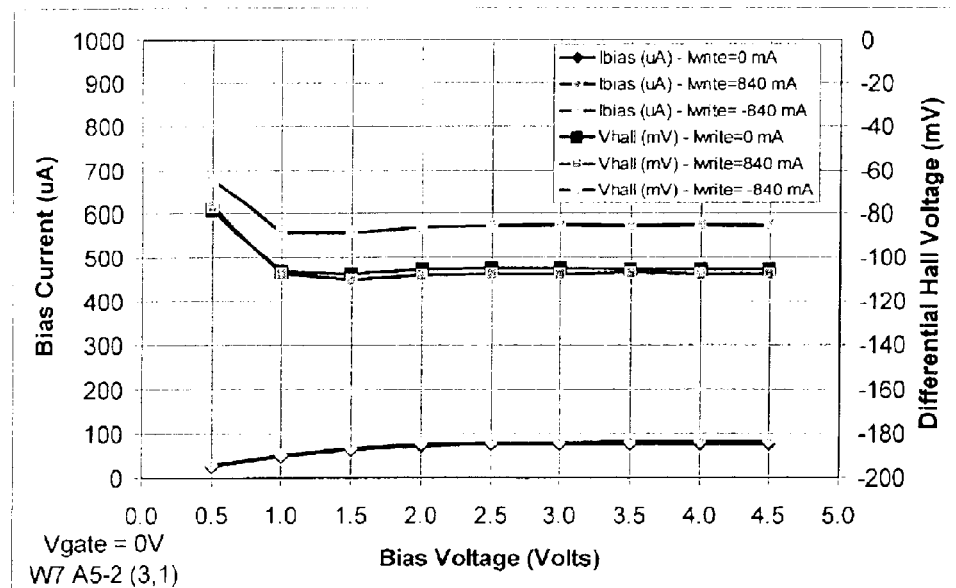
FIG. 13 shows relationship curves of bias current versus bias voltage and differential Hall voltage versus bias voltage which were obtained by experiment with a vertical Hall sensor in accordance with the present invention, in which a gate voltage was maintained at 0V.

FIGS. 11–13 are relationship curves showing sensitivity versus bias voltages and differential Hall voltages versus bias current and bias voltage that represent experimental data obtained from a gated vertical Hall sensor configured in accordance with the present invention as depicted in FIGS. 7, 8 and 9.

FIG. 11 shows a relationship curve between the bias voltage and the sensitivity in a measured magnetic field up to 200 Oe. FIG. 11 shows that the sensor has high sensitivity for a bias voltage above 3V and a gate voltage of 4V and 7V. The sensitivity is about equal for the two directions of magnetic field under this bias conditions.

FIG. 12 shows relationship curves of bias current of the Hall sensor versus bias voltage and the differential Hall voltage versus the bias voltage, in which the gate voltage is 4V. The resistive character of the curve indicates that both the dual gate transistors 830 and 840 are operating in a linear region. The differential Hall voltage is shown for three values of write current (i.e., 0 mA, 840 mA and −840 mA) in a write strap $26\mu \times 1$ micron that is positioned about 1 micron above the sensor. Further, an offset voltage is over 70 mV for this bias situation.

FIG. 13 shows relationship curves of bias current of the Hall sensor versus bias voltage and the differential Hall voltage versus the bias voltage, in which the gate voltage is 0V. Again, the differential Hall voltages is shown for the three values (i.e., 0 mV, 840 mV and −840 mA) of write current. The saturated character of the curve indicates that at least one dual gate transistor is depleted and the other transistor is slightly on and operating in the saturation mode. The Hall effect for the slightly on transistor thus disappears for one direction of the magnetic field for which the negative feedback action occurs. In FIG. 13, the sensor responds to the current (i.e., magnetic field) in a negative direction only. Further, in this bias situation, the offset voltage is over 100 mV.

From the experimental data shown in FIGS. 11–13, it can be seen that a Hall sensor in accordance with the present invention can not only detect a magnitude of a magnetic field, but can also detect a direction or orientation of the magnetic field. For example, from the curves of FIG. 13, the Hall sensor detects the magnetic field only in a negative direction.

Furthermore, the present invention appropriately controls the bias voltage so that a current change induced by a change of the effective gate bias voltage results in a significant influence on the Hall voltage. As a result, the sensitivity of the Hall sensor in accordance with the present invention is improved by a factor of ten over the conventional vertical Hall sensor integrated on a bulk CMOS, such as the sensor shown in FIG. 3. Experimental data shows that the constant voltage and constant current sensitivity according to the present invention and the conventional Hall sensor of FIG. 3 are of 1200 V/V*T versus 130 V/V*T and 200 mV/A*T versus 23 mV/A*T, respectively.

Figure 14:
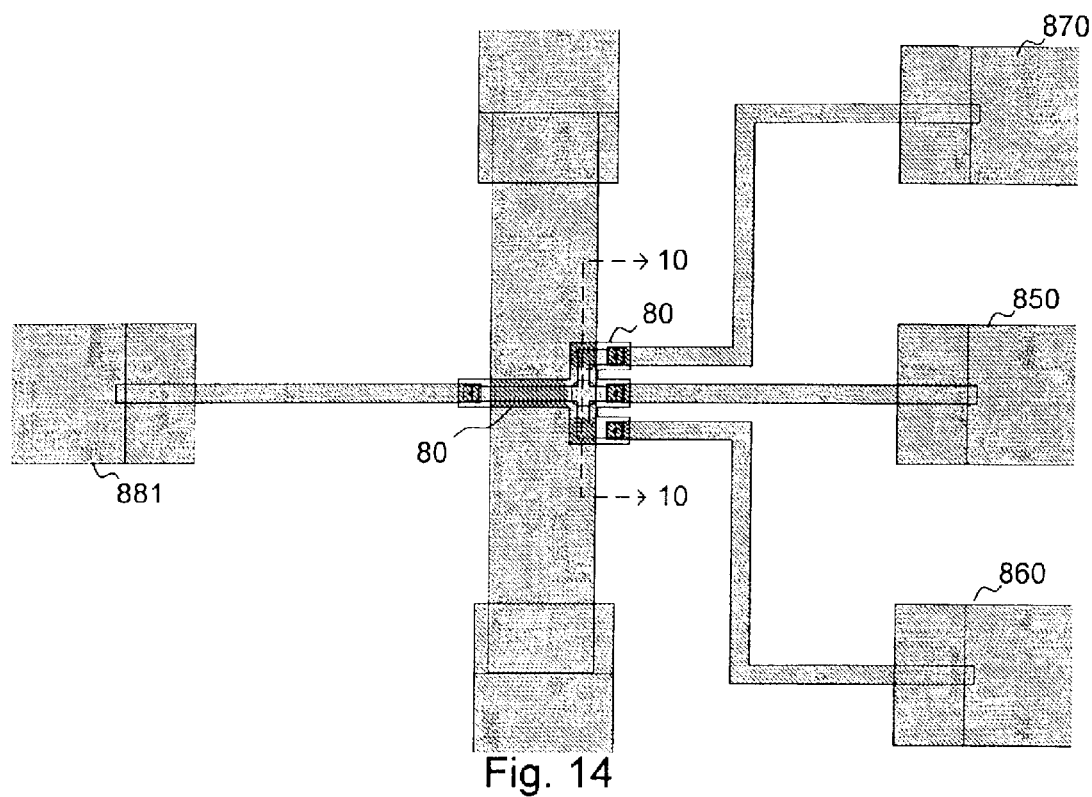
FIG. 14 shows a layout of a cross-shaped island isolated sensor in accordance with another embodiment of the present invention.
Figure 15:
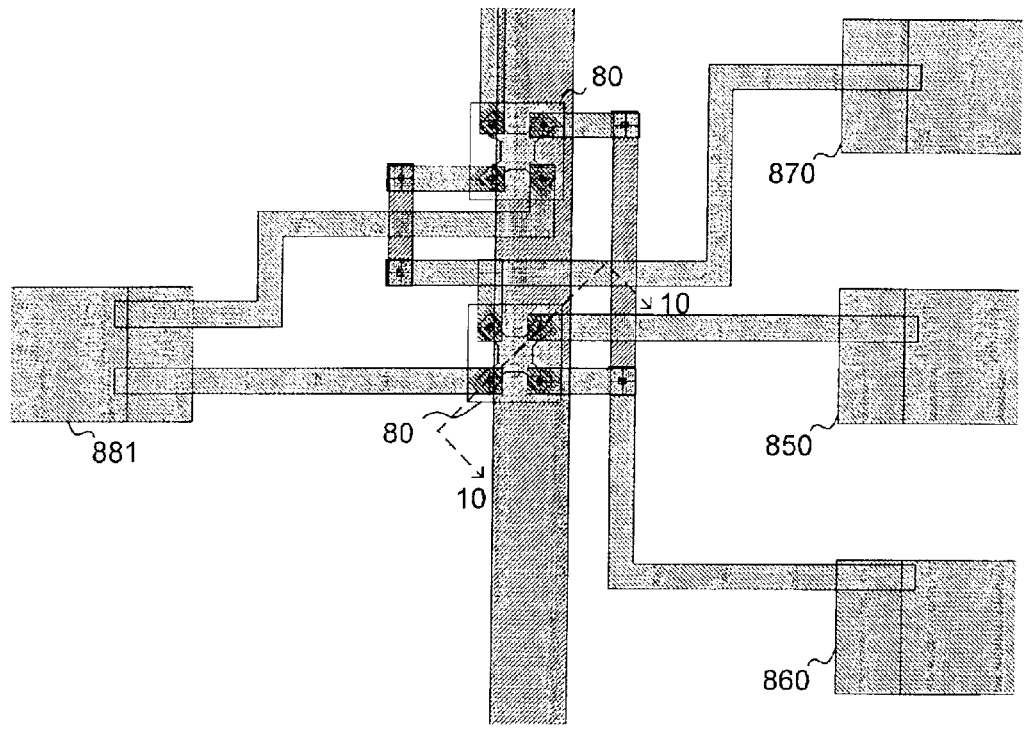
FIG. 15 shows a layout of a diamond-shaped island isolated sensor in accordance with yet another embodiment of the present invention.
Figure 16:
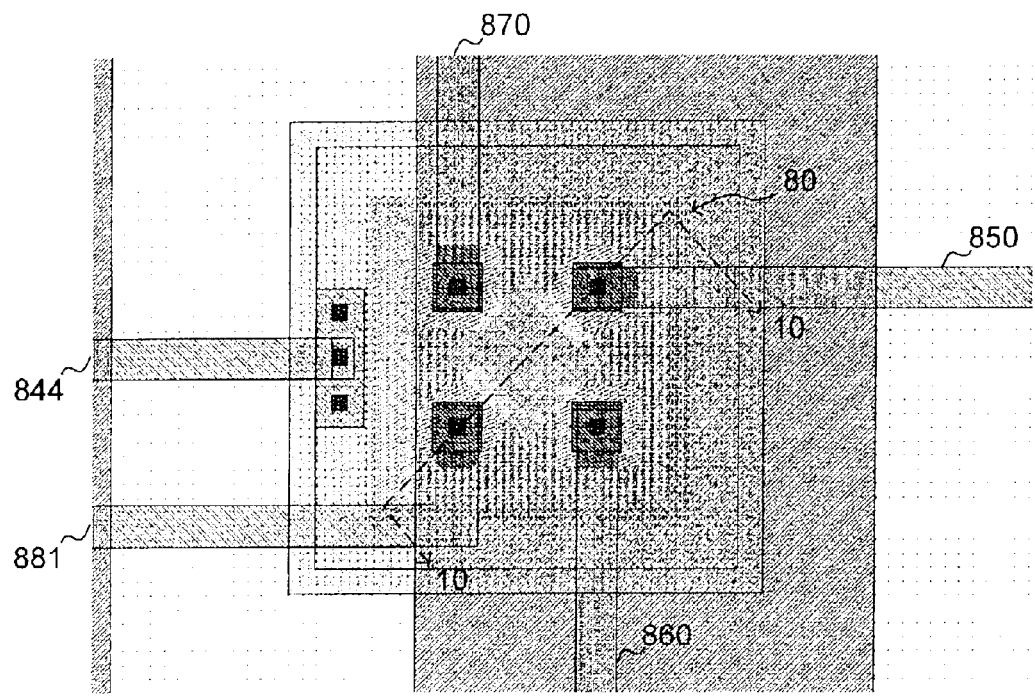
FIG. 16 shows a layout of a pn junction island isolated sensor in accordance with still another embodiment of the present invention.
Figure 17:
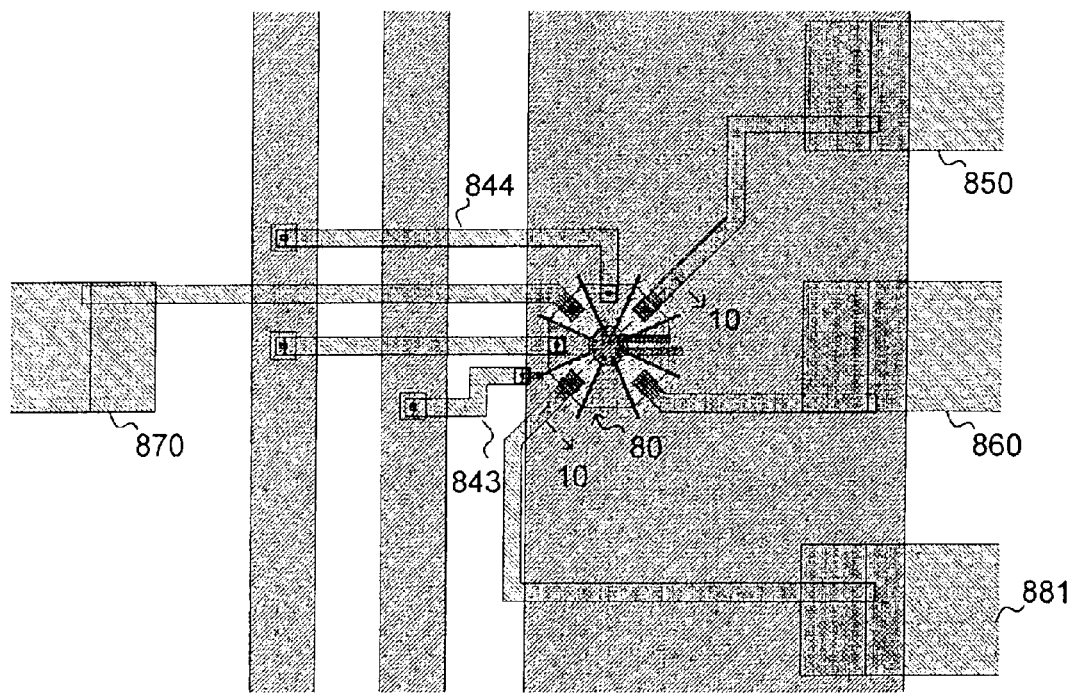
FIG. 17 shows a layout of a gated island isolated sensor in accordance with yet another embodiment of the present invention.

Although the preferred embodiment described above focuses on the structure of a vertical Hall sensor integrated with SOI CMOS devices, it should be appreciated that different configurations of horizontal Hall sensors can also be designed and manufactured consistent of the principles of the present invention. Such configurations may be lateral Hall sensors that detect the magnetic field perpendicular to the page in FIGS. 14–17. Those configurations may include island isolated sensors that may includes cross shaped sensors, as shown in FIG. 14, and diamond shaped sensors, as shown in FIG. 15. In addition to the island (LOCOS oxide isolated) isolated sensors, other configurations may include pn junction isolated sensors, as shown in FIG. 16, and gated island isolated sensors, as shown in FIG. 17. In each of these cases, two bias points are provided, one that corresponds to 850 and one that corresponds to the points 880 and 890 combined in 881 and two Hall sensing points 860 and 870 are provided. Each of the points is isolated either by silicon islands separated by a trench filled with oxide or traditional PN junctions from other points. The cross, island isolated sensor in FIG. 14 has voltage bias applied between points 850 and 881. The resulting current flows parallel to the page and is deflected by a magnetic field applied perpendicularly to the page (also seen in FIG. 10). The deflection creates a differential voltage between point 870 and 860. The shape and operation of this particular sensor is similar to standard Hall sensors, but here the sensor is built in a SOI fabrication process.

The diamond shaped, island isolated sensor in FIG. 15 has voltage bias applied between points 850 and 881. The resulting current flows parallel to the page and is deflected by a magnetic field applied perpendicularly to the page (also seen in FIG. 10). The deflection creates a differential voltage between points 870 and 860. Two sensors 80 are shown connected in such a way that the offset of one sensor is subtracted from the offset of the other, whereas the Hall voltages add up. While the shape and operation of this sensor is similar to standard Hall sensors, this sensor is built in a SOI fabrication process.

The diamond shaped, pn junction isolated sensor in FIG. 16 has voltage bias applied between points 850 and 881. The resulting current flows parallel to the page and is deflected by a magnetic field applied perpendicularly to the page. The deflection creates a differential voltage between points 870 and 860. The substrate potential may be controlled with terminal 844 to change bias current or sensor sensitivity. The shape and operation of the sensor is similar to standard Hall sensors, but here, again, the sensor is built in a SOI fabrication process and provides additional control of substrate potential.

The diamond shaped gated, island isolated sensor in FIG. 17 has voltage bias applied between points 850 and 881. The resulting current flows parallel to the page and is deflected by a magnetic field applied perpendicularly to the page (also seen in FIG. 10). The deflection creates a differential voltage between point 870 and 860. The bias and sensitivity of the sensor may be controlled with the substrate terminal 844 and the gate terminal 843. As above, the shape and operation of the sensor is similar to standard Hall sensors, but here the sensor is built in a SOI fabrication process and provides additional control of gate and substrate potential.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A magnetic sensor, comprising:
   a substrate;
   an insulating layer disposed on a top surface of the substrate;
   a semiconductor layer disposed on the insulating layer on a side opposite to that of the substrate;
   a plurality of channel regions in the semiconductor layer, the channel regions being laterally spaced from each other; and
   a plurality of gate electrodes, respective gate electrodes being disposed above each of the plurality of channel regions;
   a first terminal connected to the semiconductor layer between a pair of innermost channel regions;
   a second terminal and a third terminal respectively connected to the semiconductor layer between adjacent channel regions that are immediately adjacent the innermost channel regions; and
   a fourth terminal and a fifth terminal respectively connected to the semiconductor layer beyond the second terminal and third terminal,
   wherein the second and third terminals are positive and negtive Hall voltge terminals.

2. The sensor of claim 1, wherein each of the terminals are connected to the semiconductor layer and separated by the gate electrodes.

3. The sensor of claim 1, wherein the first terminal is a voltage supply terminal.

4. The sensor of claim 1, wherein the fourth and fifth terminals are grounded.

5. The sensor of claim 1, wherein the sensor is formed as a silicon on insulator (SOI) CMOS device.

6. The sensor of claim 1, wherein when a magnetic field is applied perpendicularly to a plane in which the semiconductor layer lies, a change in potential is induced in the channel regions.

7. The sensor of claim 6, wherein a voltage is applied to the gate electrodes.

8. The sensor of claim 7, wherein the same voltage is applied to each of the gate electrodes.

9. The sensor of claim 8, wherein Hall voltages appear at the second and third terminals in the sensor if the sensor is brought into the presence of a magnetic field.

10. A magnetic sensor for sensing a magnetic field and providing Hall voltages, comprising:
    a plurality of transistors each having a gate region, a source region and a drain region, wherein the gate regions of the plurality of transistors are isolated from each other, and two of the transistors share a common source or drain region;
    a supply voltage terminal connected to the common source or drain region; and
    positive and negative Hall voltage terminals connected to other source and drain regions, wherein application of a predetermined bias voltage on the gate regions increases a sensitivity of detecting a magnetic field near or within the Hall sensor.

11. The sensor of claim 10, wherein the sensor is fabricated as a silicon on insulator (SOI) CMOS device.

12. The sensor of claim 10, wherein non-gate regions are grounded.

13. The sensor of claim 10, further comprising gate electrodes.

14. The sensor of claim 13, wherein the gate electrodes are maintained at a predetermined voltage.

15. A magnetic sensor, comprising:
a semiconductor layer having a plurality of gated regions, the semiconductor layer being disposed on an insulating layer;
a plurality of sensing areas surrounding each of the gated regions;
a plurality of bias points each coupled to respective gated regions for providing bias voltage to the plurality of gated regions; and
a plurality of terminals respectively connected to the sensing areas and bias points.

16. The sensor of claim 15, wherein at least some of the terminals are grounded.

17. The sensor of claim 15, wherein at least two of the terminals correspond to Hall voltage output terminals.

18. The sensor of claim 15, wherein the gated regions are biased to a predetermined voltage.

19. The sensor of claim 18, wherein the predetermined voltage is sufficient to provide over 70 uV/Oe.

20. A magnetic sensor, comprising:
a substrate;
an insulating layer disposed on a top surface of the substrate;
a semiconductor layer disposed on the insulating layer on a side opposite to that of the substrate;
channel regions in the semiconductor layer; and
a plurality of gate electrodes, respective gate electrodes being disposed on the sides, below and above the channel regions, wherein the channel regions are in the shape of a cross.

21. A magnetic sensor of claim 20, wherein the electrodes are isolated with silicon islands.

22. A magnetic sensor of claim 20, wherein the electrodes are isolated with silicon islands implemented with LOCOS.

23. A magnetic sensor comprising:
a substrate;
an insulating layer disposed on a top surface of the substrate;
a semiconductor layer disposed on the insulating layer on a side opposite to that of the substrate;
channel regions in the semiconductor layer; and
a plurality of gate electrodes, respective gate electrodes being disposed on the sides, below and above the channel regions, wherein the channel regions are in the shape of a diamond.

24. A magnetic sensor of claim 23, wherein the electrodes are isolated with silicon islands and two or more sensors are connected such as to subtract offset voltage.

25. A magnetic sensor of clam 23, wherein the electrodes are isolated with pn junctions.

26. A magnetic sensor of claim 23, wherein the electrodes are isolated with pn junctions and the substrate potential is controlled.

27. A magnetic sensor of claim 23, wherein the electrodes are isolated with silicon islands and the substrate potential is controlled.

28. A magnetic sensor of claim 23, wherein the electrodes are isolated with silicon islands and the substrate potential is controlled.

29. A magnetic sensor of claim 23, wherein the electrodes are isolated with silicon islands and the gate potential is controlled.

30. A magnetic sensor of claim 23, wherein the electrodes are isolated with silicon islands and the substrate and gate potentials are controlled.

31. A magnetic sensor of claim 23, wherein the electrodes are isolated with silicon islands.

* * * * *